United States Patent
Jin et al.

(10) Patent No.: US 9,966,391 B2
(45) Date of Patent: May 8, 2018

(54) BACKPLANE FOR DISPLAY APPARATUS

(71) Applicant: Samsung Display Co., Ltd., Yongin-si, Gyeonggi-do (KR)

(72) Inventors: Minhyun Jin, Yongin-si (KR); Hyunduck Cho, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/263,648

(22) Filed: Sep. 13, 2016

(65) Prior Publication Data

US 2016/0380008 A1 Dec. 29, 2016

Related U.S. Application Data

(62) Division of application No. 14/568,494, filed on Dec. 12, 2014, now Pat. No. 9,530,805.

(30) Foreign Application Priority Data

Jul. 25, 2014 (KR) ........................ 10-2014-0095010

(51) Int. Cl.
*H01L 27/108* (2006.01)
*H01L 21/8236* (2006.01)
(Continued)

(52) U.S. Cl.
CPC ........ *H01L 27/1255* (2013.01); *H01L 27/127* (2013.01); *H01L 27/1251* (2013.01);
(Continued)

(58) Field of Classification Search
CPC ............. H01L 27/1255; H01L 27/1259; H01L 27/1251; H01L 27/127; H01L 27/1288;
(Continued)

(56) References Cited

U.S. PATENT DOCUMENTS

| 4,697,333 A * | 10/1987 | Nakahara | H01L 21/0331 148/DIG. 61 |
| 2001/0004121 A1 * | 6/2001 | Sakama | H01L 27/12 257/347 |

(Continued)

FOREIGN PATENT DOCUMENTS

| KR | 10-2000-0034640 | 6/2000 |
| KR | 10-2006-0134734 | 12/2006 |

(Continued)

*Primary Examiner* — Dzung Tran
(74) *Attorney, Agent, or Firm* — Knobbe Martens Olson & Bear LLP

(57) ABSTRACT

A backplane for a display apparatus includes a substrate including a display area and a non-display area; a first transistor formed on the display area; and a second transistor formed on the non-display area, wherein a first active layer includes a first channel area, a first source area disposed on one side of the first channel area, a first drain area disposed on the other side of the first channel area, and a low-density doped area and a halo doped area that are adjacent to both ends of the first gate electrode, and the second active layer includes a second channel area, a second source area disposed on one side of the second channel area, and a second drain area disposed on the other side of the second channel area.

10 Claims, 13 Drawing Sheets

(51) Int. Cl.
  *H01L 27/12* (2006.01)
  *H01L 29/786* (2006.01)
  *H01L 27/32* (2006.01)

(52) U.S. Cl.
  CPC ...... *H01L 27/1259* (2013.01); *H01L 27/1288* (2013.01); *H01L 29/78606* (2013.01); *H01L 29/78618* (2013.01); *H01L 29/78621* (2013.01); *H01L 29/78696* (2013.01); H01L 27/3262 (2013.01); H01L 27/3265 (2013.01); H01L 2227/323 (2013.01)

(58) Field of Classification Search
  CPC ......... H01L 29/78606; H01L 29/78618; H01L 29/78621; H01L 29/78696; H01L 29/3262; H01L 27/3265; H01L 27/3262; H01L 2227/323
  USPC .......................................... 257/296; 438/276
  See application file for complete search history.

(56) References Cited

U.S. PATENT DOCUMENTS

| | | |
|---|---|---|
| 2001/0011725 A1 | 8/2001 | Sakama et al. |
| 2005/0258488 A1 | 11/2005 | Chang et al. |
| 2006/0082568 A1 | 4/2006 | Yamazaki et al. |
| 2006/0145148 A1 | 7/2006 | Hirai et al. |
| 2006/0292763 A1 | 12/2006 | Hwang et al. |
| 2007/0013823 A1 | 1/2007 | Jung et al. |
| 2008/0017937 A1* | 1/2008 | Morimoto ........... H01L 27/1214 257/411 |
| 2008/0151162 A1 | 6/2008 | Lee et al. |
| 2009/0224255 A1* | 9/2009 | Kitakado ................. H01L 27/12 257/72 |
| 2010/0047985 A1* | 2/2010 | Dakshina Murthy ............. H01L 21/26613 438/303 |
| 2011/0042728 A1* | 2/2011 | Cheng ................. H01L 21/0217 257/288 |
| 2011/0049523 A1 | 3/2011 | Choi et al. |
| 2011/0108836 A1* | 5/2011 | Koyama ............. H01L 27/1225 257/43 |
| 2013/0286300 A1 | 10/2013 | Lee |
| 2013/0323892 A1 | 12/2013 | Flachowsky et al. |
| 2013/0323900 A1 | 12/2013 | Kuan et al. |

FOREIGN PATENT DOCUMENTS

| | | |
|---|---|---|
| KR | 10-2008-0011861 | 2/2008 |
| KR | 10-2013-0120086 | 11/2013 |

* cited by examiner

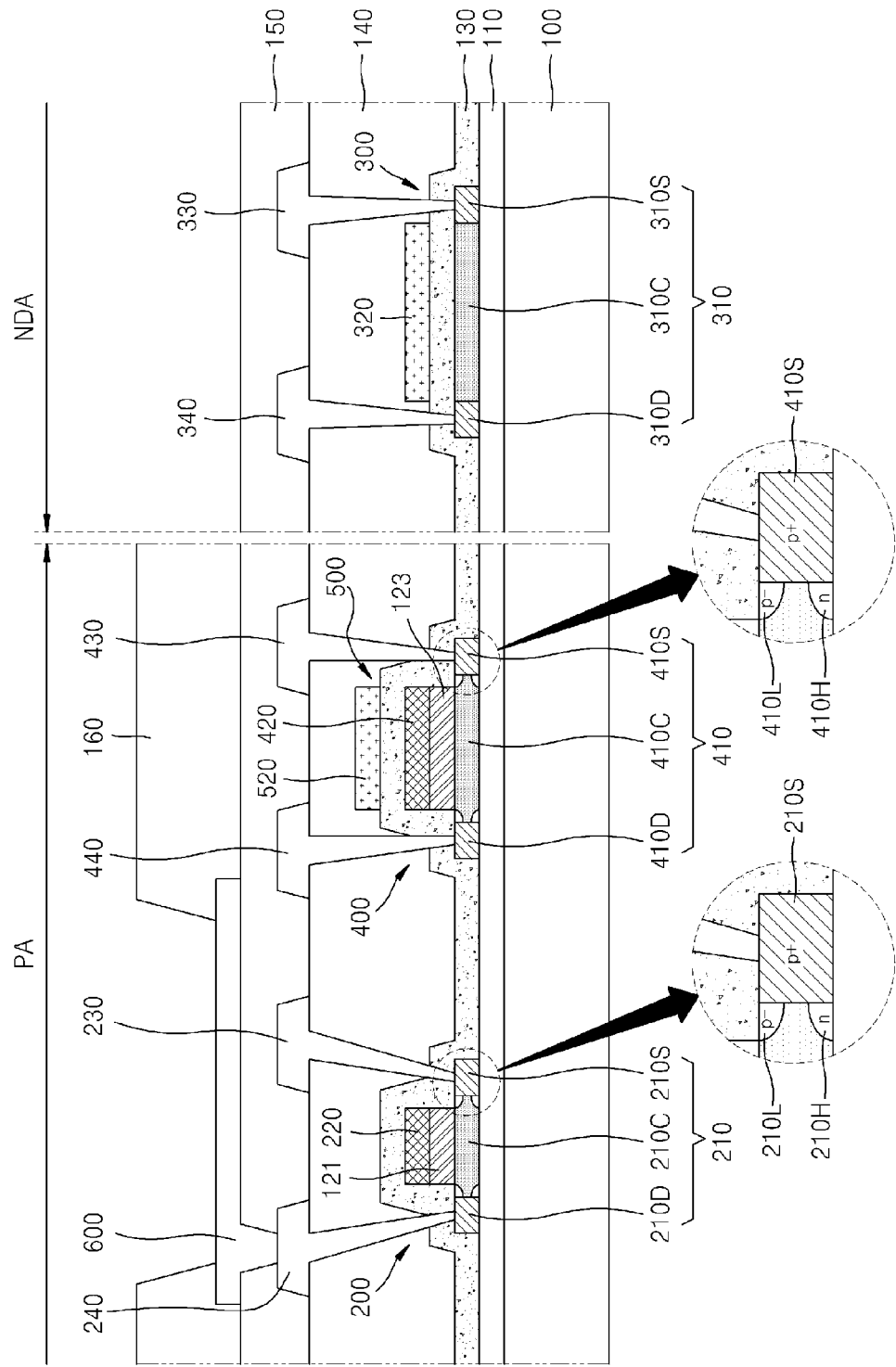

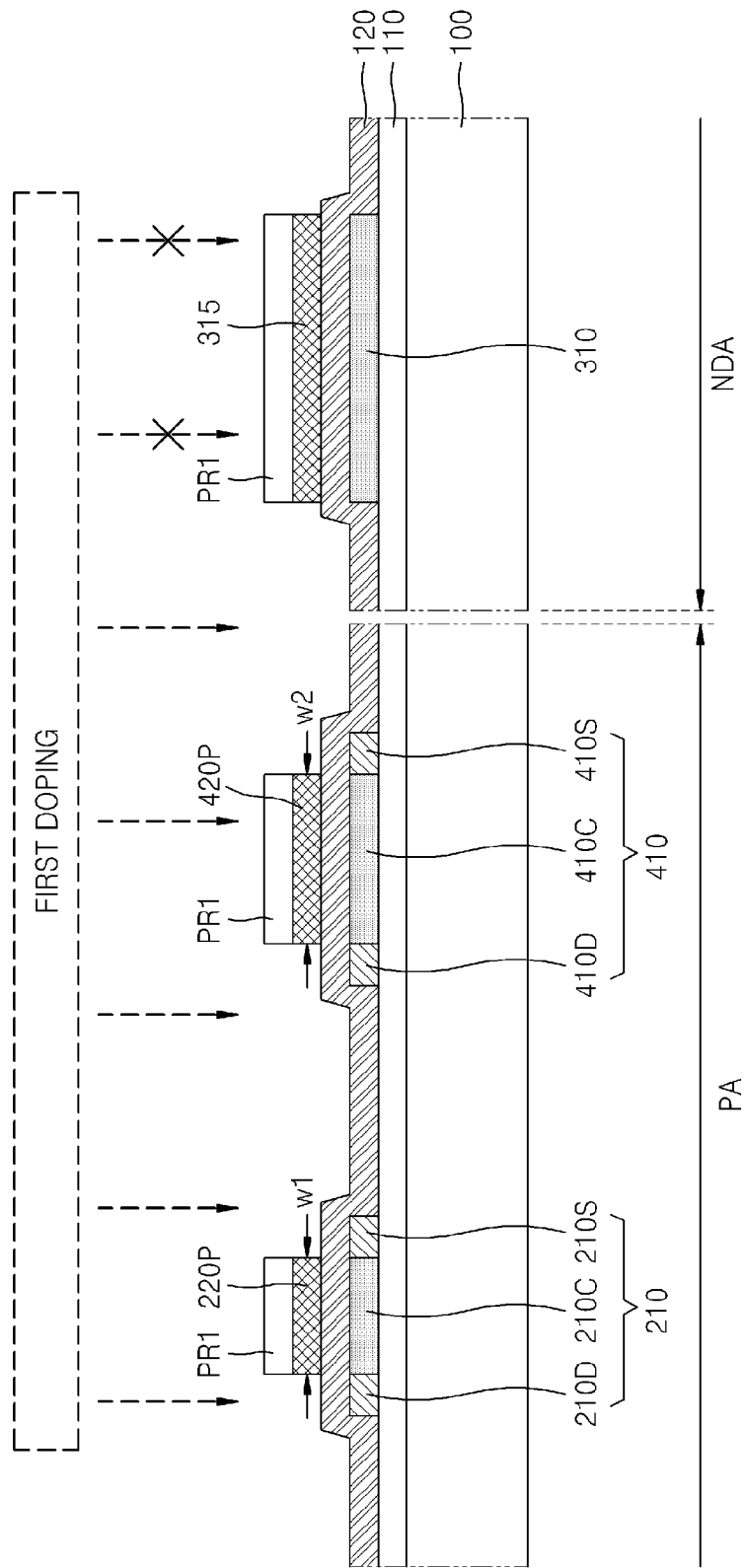

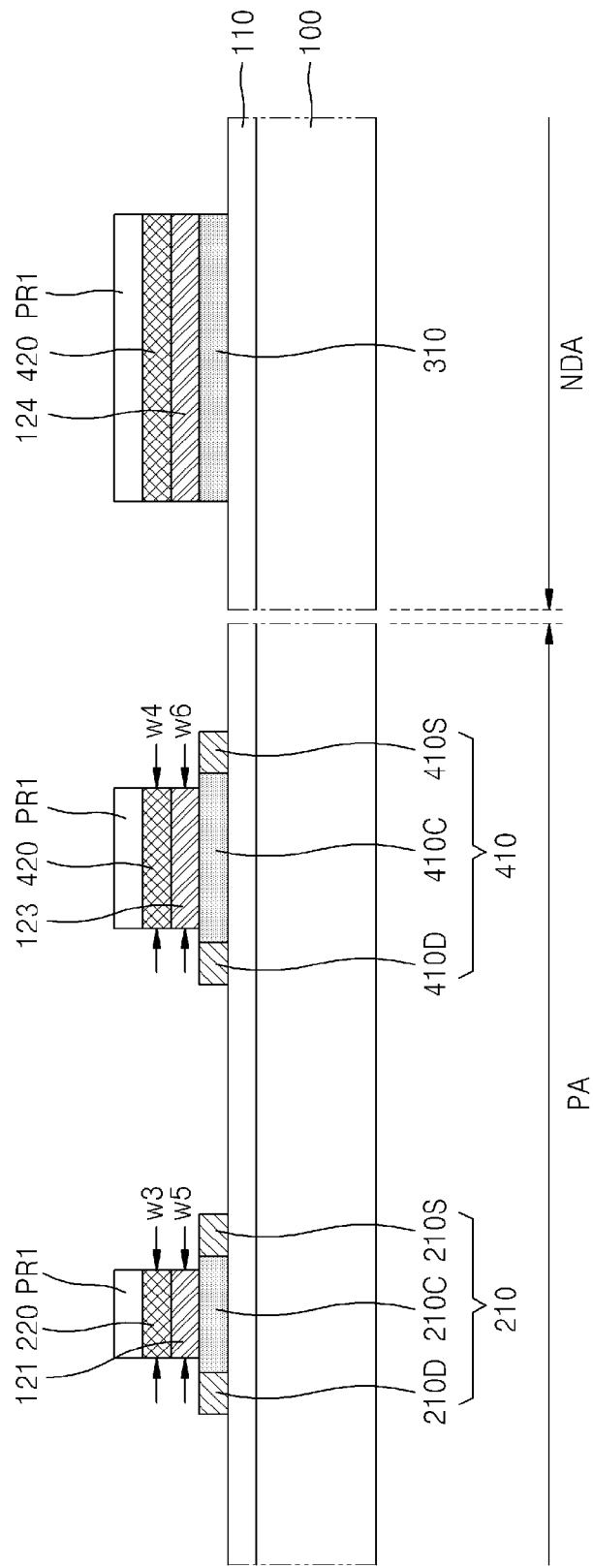

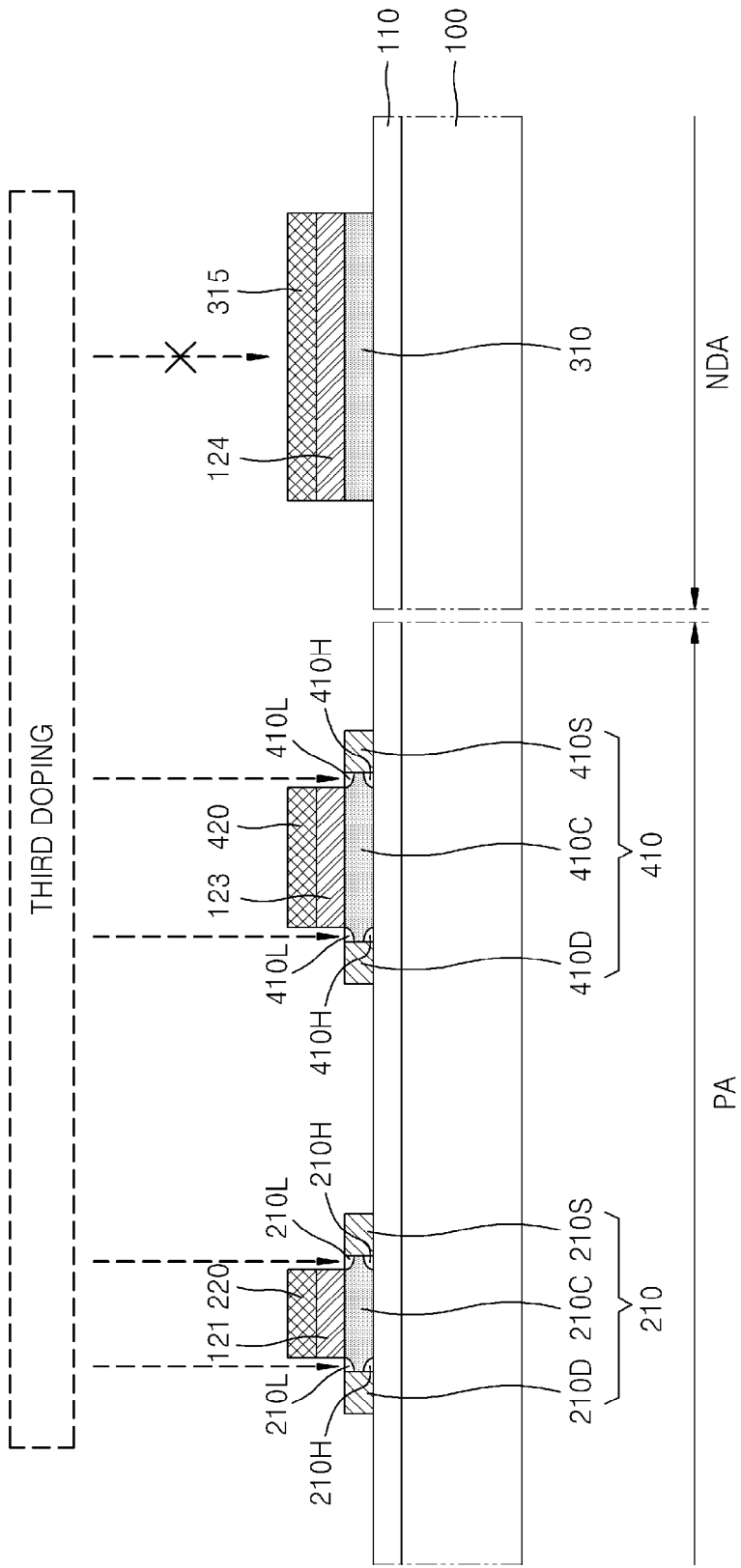

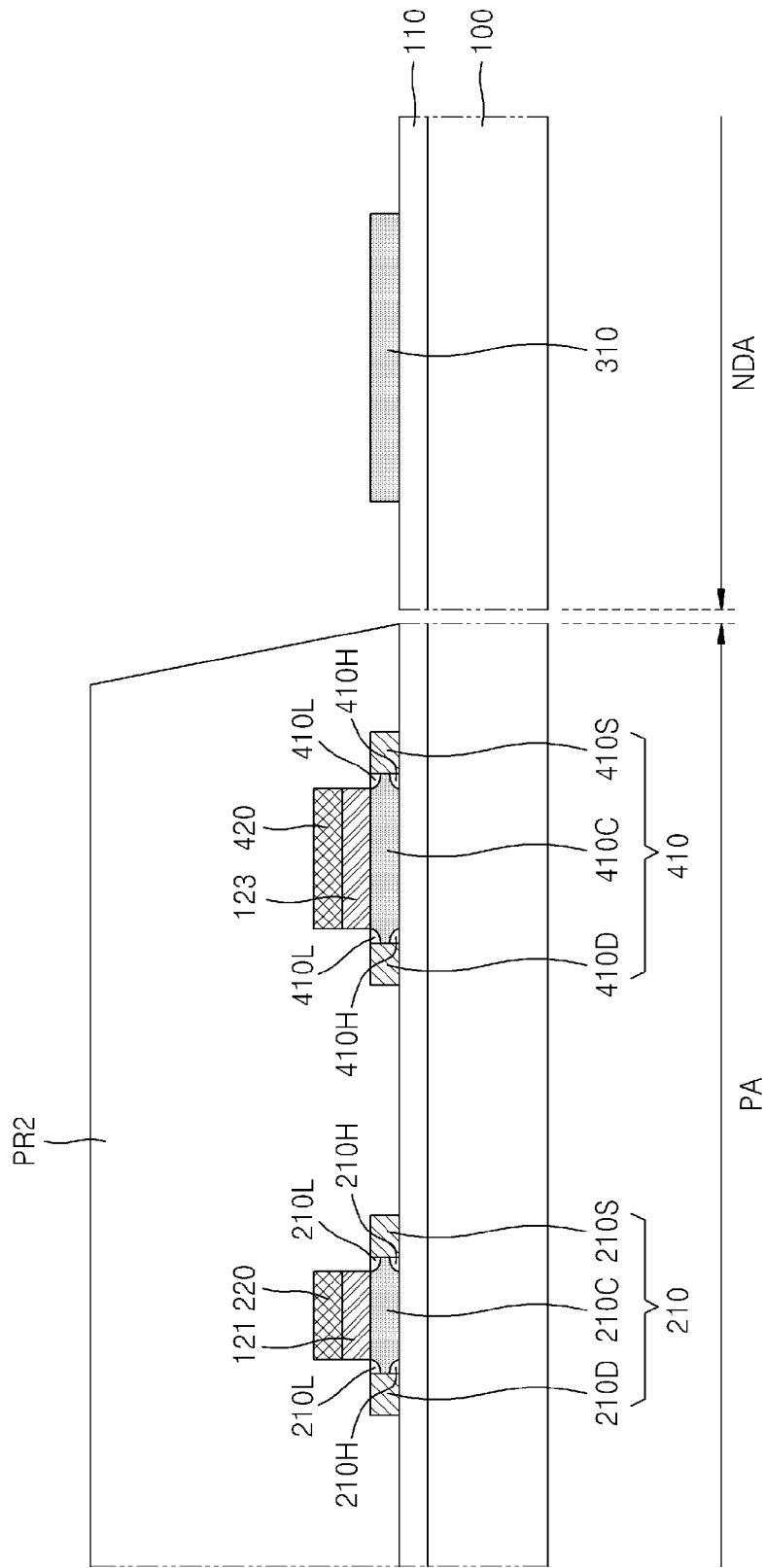

BACKPLANE FOR DISPLAY APPARATUS

CROSS-REFERENCE TO RELATED APPLICATIONS

This application is a divisional of U.S. patent application Ser. No. 14/568,494, filed Dec. 12, 2014, which claims the benefit of Korean Patent Application No. 10-2014-0095010, filed on Jul. 25, 2014, in the Korean Intellectual Property Office, the disclosure of which is incorporated herein in its entirety by reference.

BACKGROUND

Field

One or more embodiments relate to a backplane for a display apparatus and a method of manufacturing the backplane.

Description of the Related Technology

Display apparatuses display an image, and recently, an organic light-emitting display apparatus has been highlighted as a display apparatus.

The organic light-emitting display apparatus is a self-emissive display apparatus that does not require a separate light source, unlike a liquid crystal display device, and thus has a decreased thickness and weight. Also, the organic light-emitting display apparatus has high quality characteristics such as low power consumption, high brightness, and a fast response time.

SUMMARY OF CERTAIN INVENTIVE ASPECTS

One or more embodiments include a backplane for a display apparatus and a method of manufacturing the backplane.

Additional aspects will be set forth in part in the description which follows and, in part, will be apparent from the description, or may be learned by practice of the presented embodiments.

According to one or more embodiments, a backplane for a display apparatus includes a substrate including a display area and a non-display area; a first transistor including a first active layer, a first gate electrode, a first source electrode, and a first drain electrode that are formed on the display area, wherein the first gate electrode, the first source electrode, and the first drain electrode are formed on the first active layer; a second transistor including a second active layer, a second gate electrode, a second source electrode, and a second drain electrode that are formed on the non-display area, wherein the second gate electrode, the second source electrode, and the second drain electrode are formed on the second active layer; a first insulating layer formed between the first active layer and the first gate electrode; and a second insulating layer formed between the second active layer and the second gate electrode, wherein the first active layer includes a first channel area, a first source area disposed on a first side of the first channel area, a first drain area disposed on a second side of the first channel area, and a low-density doped area and a halo doped area adjacent to first and second ends of the first gate electrode, and wherein the second active layer only includes a second channel area, a second source area disposed on a first side of the second channel area, and a second drain area disposed on a second side of the second channel area.

The second insulating layer may be located on the first gate electrode.

The first gate electrode and the second gate electrode may be formed on different layers.

A width of the first insulating layer may be substantially the same as a width of the first gate electrode.

A width of the first channel area may be smaller than a width of the second channel area.

The backplane for the display apparatus may further include a third transistor including a third active layer, a third gate electrode, a third source electrode, and a third drain electrode that are formed on the display area of the substrate, wherein the third gate electrode, the third source electrode, and the third drain electrode are formed on the third active layer; and a storage capacitor formed overlapping the third transistor.

The storage capacitor may include a first electrode and a second electrode which are disposed in parallel to each other and have the second insulating layer interposed therebetween, and the first electrode may be the third gate electrode.

The second electrode of the storage capacitor may be formed on the same layer as the gate electrode and may include a same material as the second gate electrode.

The backplane for the display apparatus may further include a third insulating layer interposed between the third active layer and the third gate electrode and may have the substantially same size as the third gate electrode.

The third insulating layer may be formed on the same layer as the first insulating layer and may include a same material as the first insulating layer.

The third active layer may include a third channel area, a third source area disposed on a first side of the third channel area, a third drain area disposed on a second side of the third channel area, and a low-density doped area and a halo doped area that are adjacent to first and second ends of the third gate electrode.

According to one or more embodiments, a method of manufacturing a backplane for a display apparatus includes forming a first active layer located on a display area of a substrate, and a second active layer located on a non-display area of the substrate; doping the first active layer and thus forming a first source area and a first drain area that are disposed on first and second sides of the first channel area by having the first channel area arranged therebetween; forming a first gate electrode on the first active layer; forming a low-density doped area in the first active layer by using the first gate electrode as a mask and by using impurity having lower density than the first source area and the first drain area; forming a halo doped area by doping the first active layer by using the first gate electrode as a mask; forming a second gate electrode on the second active layer; forming a second source area and a second drain area that are disposed on first and second sides of the second channel area by having the second channel area arranged therebetween, by doping the second active layer by using the second gate electrode as a mask; and forming a first source electrode and a first drain electrode that are connected to the first source area and the first drain area of the first active layer, and forming a second source electrode and a second drain electrode that are connected to the second source area and the second drain area of the second active layer.

The second active layer may be formed from the same layer as the first gate electrode and may be covered by a metal pattern having a width equal to or greater than a width of the second active layer.

The method may further include patterning a first insulating layer that is interposed between the first active layer and the first gate electrode.

The method may further include forming a third active layer located on the display area of the substrate; doping the third active layer and thus forming a third source area and a third drain area; forming a third gate electrode on the third active layer; forming a low-density doped area and a halo doped area by doping the third active layer by using the third gate electrode as a mask; and forming a storage capacitor on the third gate electrode.

Forming the third source area and the third drain area and doping the first active layer may be simultaneously performed, and forming the low-density doped area and the halo doped area by doping the third active layer, forming a low-density doped area in the first active layer, and forming a halo doped area by doping the first active layer may be simultaneously performed.

Forming the storage capacitor may include forming a first electrode of the storage capacitor; and forming a second electrode of the storage capacitor, wherein the first electrode is the third gate electrode.

The third gate electrode may be formed on the same layer as the first gate electrode.

The second electrode of the storage capacitor may be formed on the same layer as the second gate electrode.

The method may further include forming a second insulating layer between the second active layer and the second gate electrode, wherein the second insulating layer is interposed between the first electrode of the storage capacitor and the second electrode of the storage capacitor.

BRIEF DESCRIPTION OF THE DRAWINGS

These and/or other aspects will become apparent and more readily appreciated from the following description of the embodiments, taken in conjunction with the accompanying drawings in which:

FIG. 3 is a cross-sectional view illustrating the portion of the backplane of FIG. 1, taken along a line and FIGS. 4A through 4J are cross-sectional views illustrating a method of manufacturing the backplane for the display apparatus, according to an embodiment.

DETAILED DESCRIPTION OF CERTAIN INVENTIVE EMBODIMENTS

Figure 1:
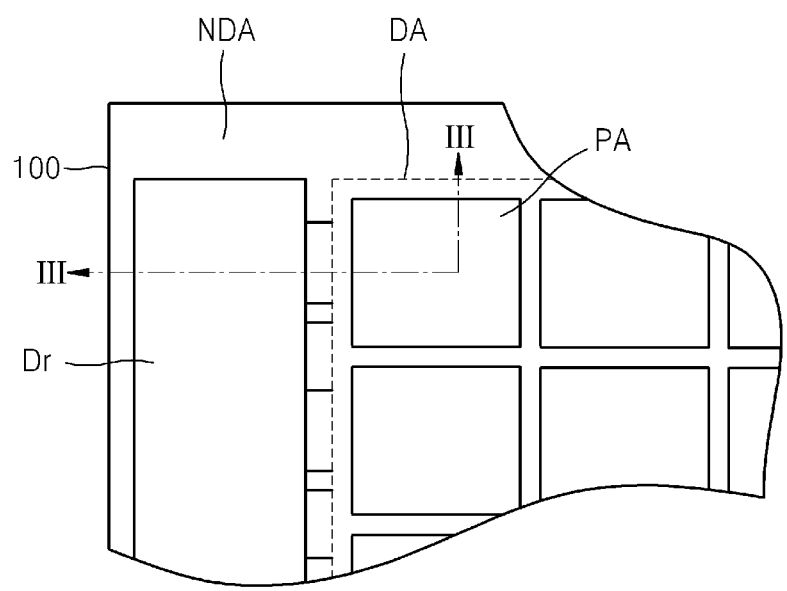
FIG. 1 is a plan view illustrating a portion taken from a backplane for a display apparatus, according to an embodiment.

As the invention allows for various changes and numerous embodiments, particular embodiments will be illustrated in the drawings and described in detail in the written description. The effects and features of the present invention are described more fully with reference to the accompanying drawings, in which certain embodiments of the invention are shown. The invention may, however, be embodied in many different forms and should not be construed as being limited to the embodiments set forth herein.

Those components that are the same or are in correspondence are generally rendered the same reference numeral regardless of the figure number, and redundant explanations are omitted.

Throughout the specification, while such terms as "first," "second," and the like may be used to describe various components, such components must not be limited to the above terms. The above terms are used only to distinguish one component from another.

Throughout the specification, a singular form may include plural forms, unless there is a particular description contrary thereto.

Throughout the specification, terms such as "comprise" or "comprising" are used to specify existence of features and/or components described in the specification, not excluding the existence of one or more other features and/or one or more other components.

It will be understood that when a layer, an area, a component, or the like is referred to as being "on" another layer, area, or component, it can be directly on another layer, area, or component or an intervening layer, area, or component may also be present.

In the drawings, the thicknesses of layers and regions may be exaggerated for clarity. For example, the thicknesses and sizes of elements in the drawings are arbitrarily shown for convenience of description, thus, the spirit and scope of the present invention are not necessarily defined by the drawings.

Also, it should also be noted that in some alternative implementations, the steps of all methods described herein may occur out of the order. For example, two steps illustrated in succession may in fact be executed substantially concurrently or the two steps may sometimes be executed in the reverse order.

As used herein, the term "and/or" includes any and all combinations of one or more of the associated listed items.

Figure 2:
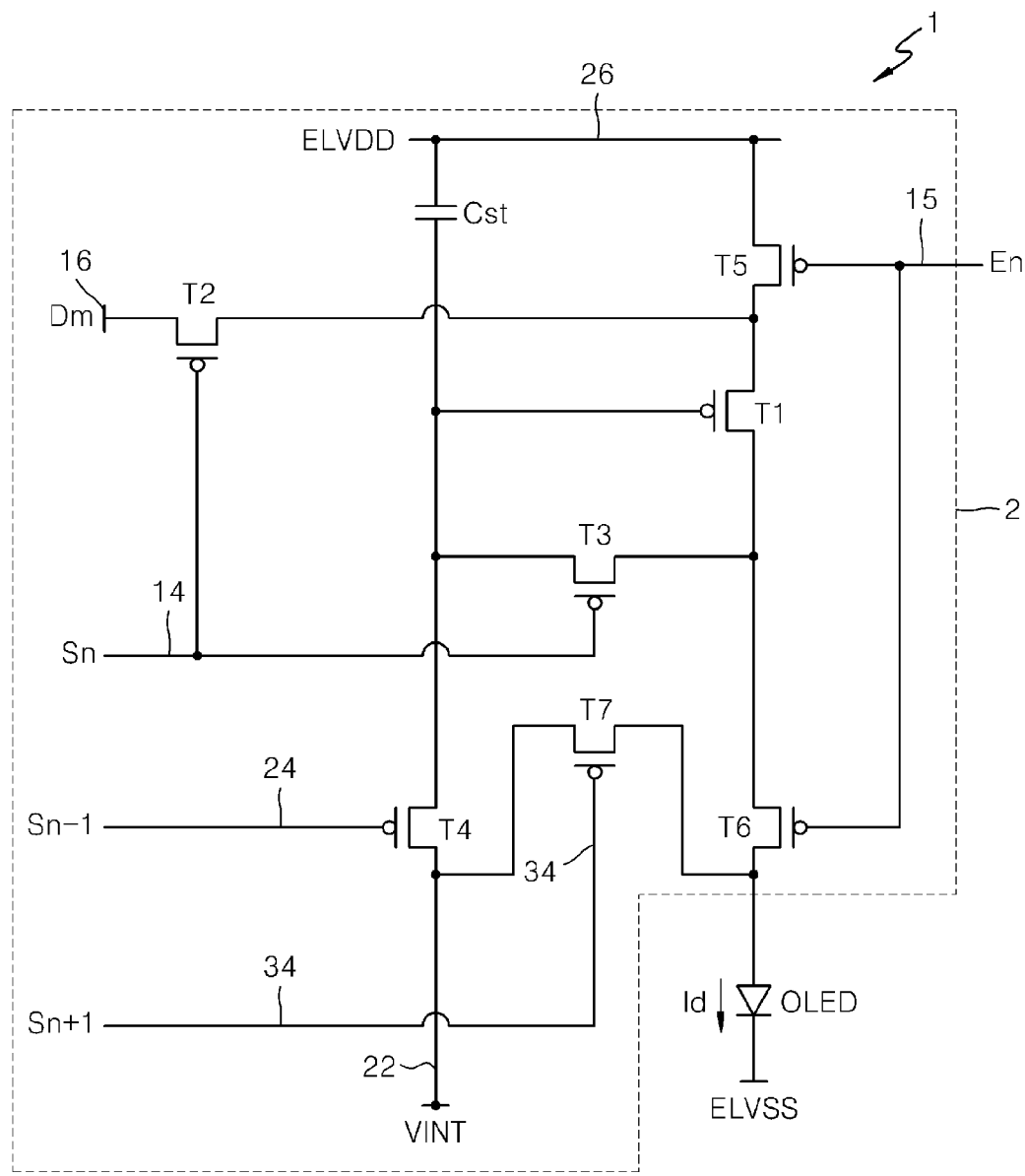
FIG. 2 is an equivalent circuit diagram of a pixel formed in a pixel area of the backplane for the display apparatus of FIG. 1.

FIG. 1 is a plan view illustrating a portion taken from a backplane for a display apparatus, according to an embodiment. FIG. 2 is an equivalent circuit diagram of a pixel formed in a pixel area of the backplane for the display apparatus of FIG. 1. In the pixel area of the backplane for the display apparatus, a pixel circuit and an organic light-emitting device OLED may be formed. FIG. 2 is the equivalent circuit diagram of the pixel of an organic light-emitting display apparatus in which the backplane for the display apparatus is used. Referring to FIG. 2, the backplane for the display apparatus is used in the organic light-emitting display apparatus, but in another embodiment, the backplane for the display apparatus may be used in another display apparatus such as, for example, a liquid crystal display device.

Referring to FIG. 1, the backplane for the display apparatus includes a display area DA and a non-display area NDA. The display area DA of the backplane includes a plurality of pixel areas PA, and a pixel circuit 2 (refer to FIG. 2) is arranged in each of the pixel areas PA. In the non-display area NDA of the backplane, a driving circuit unit Dr for driving a plurality of pixels 1 (refer to FIG. 2) formed in the display area DA is arranged.

Referring to FIG. 1, the driving circuit unit Dr is disposed on the left side of the display area DA, but a position of the driving circuit unit Dr is not limited thereto, provided that the driving circuit unit Dr is formed in the non-display area NDA.

The display area DA is an area where an image is displayed, and the pixel 1 (refer to FIG. 2) may be formed in each of the pixel areas PA arranged in the display area DA. The driving circuit unit Dr may include a driving circuit that generates a scan signal for driving the pixels 1, a data signal, emission control signals, and a control signal for controlling the aforementioned signals.

Referring to FIG. 2, the pixel circuit 2 that includes a plurality of thin film transistors (TFTs) T1 through T7 and at least one storage capacitor Cst may be formed in one pixel area PA. The pixel circuit 2 is electrically connected to the organic light-emitting device OLED, and the organic light-emitting device OLED receives a driving current via the pixel circuit 2 and thus emits light.

The TFTs T1 through T7 may include a driving TFT T1, a switching TFT T2, a compensating TFT T3, a first initialization TFT T4, a first emission control TFT T5, a second emission control TFT T6, and a second initialization TFT T7.

A first scan line 14 for transmitting a first scan signal Sn to the switching TFT T2 and the compensating TFT T3, a second scan line 24 for transmitting a second scan signal Sn−1 to the first initialization TFT T4, a third scan line 34 for transmitting a third scan signal Sn+1 to the second initialization TFT T7, an emission control line 15 for transmitting an emission control signal En to the first emission control TFT T5 and the second emission control TFT T6, a data line 16 for transmitting a data signal Dm, a driving voltage line 26 for delivering a first power voltage ELVDD, and an initialization voltage line 22 for delivering an initialization voltage VINT that initializes the driving TFT T1 may all be formed in the pixel area PA.

A drain electrode of the driving TFT T1 may be electrically connected to a pixel electrode of the organic light-emitting device OLED via the second emission control TFT T6. The driving TFT T1 may receive the data signal Dm according to a switching operation by the switching TFT T2 and thus may supply a driving current Id to the organic light-emitting device OLED.

A gate electrode of the switching TFT T2 may be connected to the first scan line 14. A source electrode of the switching TFT T2 may be connected to the data line 16. A drain electrode of the switching TFT T2 may be connected to a source electrode of the driving TFT T1 and may also be connected to the driving voltage line 26 via the first emission control TFT T5.

The switching TFT T2 is turned on in response to the first scan signal Sn that is transmitted via the first scan line 14, and thus performs the switching operation of transmitting the data signal Dm to the source electrode of the driving TFT T1.

A gate electrode of the compensating TFT T3 may be connected to the first scan line 14. A source electrode of the compensating TFT T3 may be connected to the drain electrode of the driving TFT T1 and may also be connected to the pixel electrode of the organic light-emitting device OLED via the second emission control TFT T6. A drain electrode of the compensating TFT T3 may be connected to a first electrode of the storage capacitor Cst, a source electrode of the first initialization TFT T4, and the gate electrode of the driving TFT T1. The compensating TFT T3 is turned on in response to the first scan signal Sn that is transmitted via the first scan line 14, and thus diode-connects the driving TFT T1 by connecting the gate electrode and the drain electrode of the driving TFT T1.

A gate electrode of the first initialization TFT T4 may be connected to the second scan line 24. A drain electrode of the first initialization TFT T4 may be connected to the initialization voltage line 22. The source electrode of the first initialization TFT T4 may be connected to the first electrode of the storage capacitor Cst, the drain electrode of the compensating TFT T3, and the gate electrode of the driving TFT T1. The first initialization TFT T4 may be turned on in response to the second scan signal Sn−1 that is transmitted via the second scan line 24, may deliver an initialization voltage VINT to the gate electrode of the driving TFT T1, and thus may perform an initialization operation of initializing a voltage of the gate electrode of the driving TFT T1.

A gate electrode of the first emission control TFT T5 may be connected to the emission control line 15. A source electrode of the first emission control TFT T5 may be connected to the driving voltage line 26. A drain electrode of the first emission control TFT T5 may be connected to the source electrode of the driving TFT T1 and the drain electrode of the switching TFT T2.

A gate electrode of the second emission control TFT T6 may be connected to the emission control line 15. A source electrode of the second emission control TFT T6 may be connected to the drain electrode of the driving TFT T1 and the source electrode of the compensating TFT T3. A drain electrode of the second emission control TFT T6 may be electrically connected to the pixel electrode of the organic light-emitting device OLED. The first emission control TFT T5 and the second emission control TFT T6 are simultaneously turned on in response to the emission control signal En that is transmitted via the emission control line 15, so that the first power voltage ELVDD is supplied to the organic light-emitting device OLED and thus the driving current Id flows in the organic light-emitting device OLED.

A gate electrode of the second initialization TFT T7 may be connected to the third scan line 34. A source electrode of the second initialization TFT T7 may be connected to the pixel electrode of the organic light-emitting device OLED. A drain electrode of the second initialization TFT T7 may be connected to the initialization voltage line 22. The second initialization TFT T7 may be turned on in response to the third scan signal Sn+1 that is transmitted via the third scan line 34 and thus may initialize the pixel electrode of the organic light-emitting device OLED.

A second electrode of the storage capacitor Cst may be connected to the driving voltage line 26. The first electrode of the storage capacitor Cst may be connected to the gate electrode of the driving TFT T1, the drain electrode of the compensating TFT T3, and the source electrode of the first initialization TFT T4.

An opposite electrode of the organic light-emitting device OLED may be connected to a second power voltage ELVSS. The organic light-emitting device OLED emits light by receiving the driving current Id from the driving TFT T1 and thus displays an image.

FIG. 3 is a cross-sectional view illustrating the portion of the backplane of FIG. 1, taken along a line III-III. In one embodiment, the backplane for the display apparatus includes a first transistor 200 arranged in the pixel area PA of the display area DA, and a second transistor 300 arranged in the non-display area NDA. The backplane for the display apparatus may include a third transistor 400 and a storage capacitor 500 overlapping the third transistor 400 that are arranged in the pixel area PA of the display area DA.

Each of the first transistor 200 and the third transistor 400 may be one of the TFTs T1 through T7 described with reference to FIG. 2. For example, the first transistor 200 may be the second emission control TFT T6 of FIG. 2, and the third transistor 400 may be the driving TFT T1, but embodiments are not limited thereto. In another embodiment, the first transistor 200 may be the driving TFT T1, and the second transistor 300 may be the switching TFT T2, the compensating TFT T3, the first initialization TFT T4, the first emission control TFT T5, the second emission control TFT T6, or the second initialization TFT T7.

In a display area DA (such as for example the pixel area PA), a substrate 100, a buffer layer 110, a first transistor 200, the third transistor 400, and the storage capacitor 500 that overlaps the third transistor 400 are arranged. The first transistor 200 includes a first active layer 210, a first gate electrode 220, a first source electrode 230, and a first drain electrode 240, and the third transistor 400 includes a third active layer 410, a third gate electrode 420, a third source electrode 430, and a third drain electrode 440.

The substrate 100 may be a transparent glass substrate or a transparent plastic substrate. In another embodiment, the substrate 100 may be an opaque substrate formed of metal.

The buffer layer 110 may be further arranged on the substrate 100 so as to form a planar surface and to prevent penetration of foreign substances. The buffer layer 110 may be formed as a single layer or multiple layers including an inorganic material such as, for example, silicon nitride and/or silicon oxide.

The first active layer 210 and the third active layer 410 may be formed on the buffer layer 110. The first active layer 210 and the third active layer 410 may include a semiconductor including, for example, amorphous silicon or crystalline silicon.

The first active layer 210 includes a first channel area 210C, and a first source area 210S and a first drain area 210D that are disposed on both sides of the first channel area 210C. Also, the first active layer 210 includes a first low-density doped area 210L and a first halo doped area 210H that are disposed at each of ends of the first channel area 210C and are adjacent to each of the first source area 210S and the first drain area 210D. The first low-density doped area 210L is doped with low-density impurity, compared to the first source area 210S and the first drain area 210D.

The third active layer 410 includes a third channel area 410C, and a third source area 410S and a third drain area 410D that are disposed on both sides of the third channel area 410C. Also, the third active layer 410 includes a second low-density doped area 410L and a second halo doped area 410H that are disposed at each of ends of the third channel area 410C and are adjacent to each of the third source area 410S and the third drain area 410D. The second low-density doped area 410L is doped with low-density impurity, compared to the third source area 410S and the third drain area 410D.

Each of widths of the first channel area 210C and the third channel area 410C may be smaller than a width of a second channel area 310 described below. In one embodiment, in order to embody the display apparatus with high resolution, a size of a pixel is decreased whereas the number of TFTs that are disposed in one pixel area PA is increased. Thus, each of widths of the first active layer 210 and the third active layer 410 may be smaller than a width of the second active layer 310, so that each of the widths of the first channel area 210C and the third channel area 410C may be smaller than the width of the second channel area 310C.

If a width of a channel area is decreased, a short channel problem may occur, an off current Ioff may be increased and performance of a transistor may deteriorate. However, in one embodiment, the first channel area 210C and the third channel area 410C include the first and second low-density doped areas 210L and 410L and the first and second halo doped areas 210H and 410H, thus, the above-problems may be solved.

The first gate electrode 220 may be disposed to correspond to the first channel area 210C by having the first insulating layer 121 interposed therebetween, and the third gate electrode 420 may be disposed to correspond to the third channel area 410C by having the third insulating layer 123 interposed therebetween.

The first insulating layer 121 and the third insulating layer 123 are gate insulating layers and may have patterns substantially similar to the first gate electrode 220 and the third gate electrode 420, respectively. For example, widths of the first insulating layer 121 and the third insulating layer 123 may be the same as widths of the first gate electrode 220 and the third gate electrode 420, respectively.

The first insulating layer 121 is formed on the same layer as the third insulating layer 123 and comprises the same material as the third insulating layer 123. For example, the first insulating layer 121 and the third insulating layer 123 may include inorganic materials including $SiO_2$, SiNx, SiON, $Al_2O_3$, $TiO_2$, $Ta_2O_5$, $HfO_2$, $ZrO_2$, BST, PZT, or the like.

The first gate electrode 220 is formed on the same layer as the third gate electrode 420 and comprises the same material as the third gate electrode 420. For example, each of the first gate electrode 220 and the third gate electrode 420 may be formed as a single layer or multiple layers including at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), or the like.

The first source electrode 230 and the first drain electrode 240 that contact the first source area 210S and the first drain area 210D of the first active layer 210, respectively, are disposed above the first gate electrode 220 by having the second insulating layer 130 and the interlayer insulating layer 140 interposed therebetween. The third source electrode 430 and the third drain electrode 440 that contact the third source area 410S and the third drain area 410D of the third active layer 410, respectively, are disposed above the third gate electrode 420 by having the second insulating layer 130 and the interlayer insulating layer 140 interposed therebetween.

The second insulating layer 130 may include inorganic materials including $SiO_2$, SiNx, SiON, $Al_2O_3$, $TiO_2$, $Ta_2O_5$, $HfO_2$, $ZrO_2$, BST, PZT, or the like. The interlayer insulating layer 140 may include polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinylalcohol-based polymer, or a combination thereof.

The first source electrode 230, the first drain electrode 240, the third source electrode 430, and the third drain electrode 440 may be formed on the same layer and comprise the same material as each other. For example, each of the first source electrode 230, the first drain electrode 240, the third source electrode 430, and the third drain electrode 440 may be formed as a single layer or multiple layers including at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), or the like.

The storage capacitor 500 may be formed on the third transistor 400. The storage capacitor 500 is formed while overlapping the third transistor 400, so that a space may be fully used and required capacitance may be assured so as to embody the display apparatus with high resolution.

The first electrode 420 and the second electrode 520 of the storage capacitor 500 are disposed in parallel to each other by having the second insulating layer 130 interposed therebetween. A component with reference numeral 420 may perform not only a function as the gate electrode of the third transistor 400 but may also perform a function as a first electrode of the storage capacitor 500. The second electrode 520 of the storage capacitor 500 may be formed on the same layer as a second gate electrode 320 of the second transistor 300 and comprise the same material as the second gate electrode 320 of the second transistor 300 described below.

A pixel electrode 600 may be connected to the first drain electrode 240 of the first transistor 200. For example, when the backplane for the display apparatus according to one embodiment is used in the organic light-emitting display apparatus, an intermediate layer including an organic emission layer, and an opposite electrode may be formed on the pixel electrode 600 that is exposed via an opening of a pixel defining layer 160.

In the non-display area NDA, the substrate 100, the buffer layer 110, and the second transistor 300 are arranged. The second transistor 300 includes a second active layer 310, the second gate electrode 320, a second source electrode 330, and a second drain electrode 340.

The second active layer 310 includes a second channel area 310C, and a second source area 310S and a second drain area 310D that are disposed on both sides of the second channel area 310C. Unlike the first active layer 210 and/or the third active layer 410, the second active layer 310 does not include a low-density doped area and a halo doped area.

The second gate electrode 320 may be disposed to correspond to the second channel area 310C by having the second insulating layer 130 interposed therebetween. The second insulating layer 130 may simultaneously perform a function as a gate insulating layer of the second transistor 300 and a function as a dielectric layer of the storage capacitor 500 in the pixel area PA. The second gate electrode 320 and the first gate electrode 220 are formed on different layers. As described above, the second gate electrode 320 may be formed on the same layer as the second electrode 520 of the storage capacitor 500 and comprise the same material as the second electrode 520 of the storage capacitor 500.

The second source electrode 330 and the second drain electrode 340 that contact the second source area 310S and the second drain area 310D of the second active layer 310, respectively, are disposed above the second gate electrode 320 by having the interlayer insulating layer 140 interposed therebetween. The second source electrode 330 and the second drain electrode 340 may be formed on the same layer as the first source electrode 230 and the first drain electrode 240. The second source electrode 330 and the second drain electrode 340 may comprise the same material as the first source electrode 230 and the first drain electrode 240.

FIGS. 4A through 4J are cross-sectional views illustrating a method of manufacturing the backplane for the display apparatus, according to an embodiment.

Figure 4A:
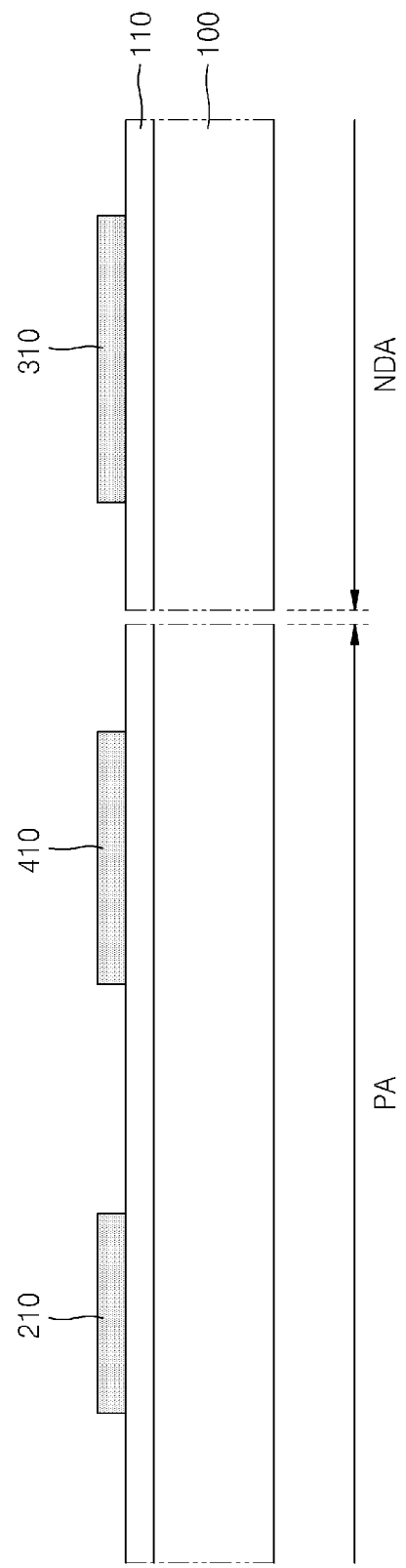

FIG. 4A is a cross-sectional view illustrating a first mask process for the backplane for the display apparatus.

Referring to FIG. 4A, the buffer layer 110 is formed on the substrate 100 in which a display area including a pixel area PA and a non-display area NDA are defined, and then a semiconductor layer (not shown) is formed. Afterward, the semiconductor layer is patterned so that the first active layer 210, the second active layer 310, and the third active layer 410 are formed. Here, each of a width of the first active layer 210 and a width of the third active layer 410 may be smaller than a width of the second active layer 310. The buffer layer 110 may be formed as a single layer or multiple layers including an inorganic material such as, for example, silicon nitride and/or silicon oxide.

Figure 4B:
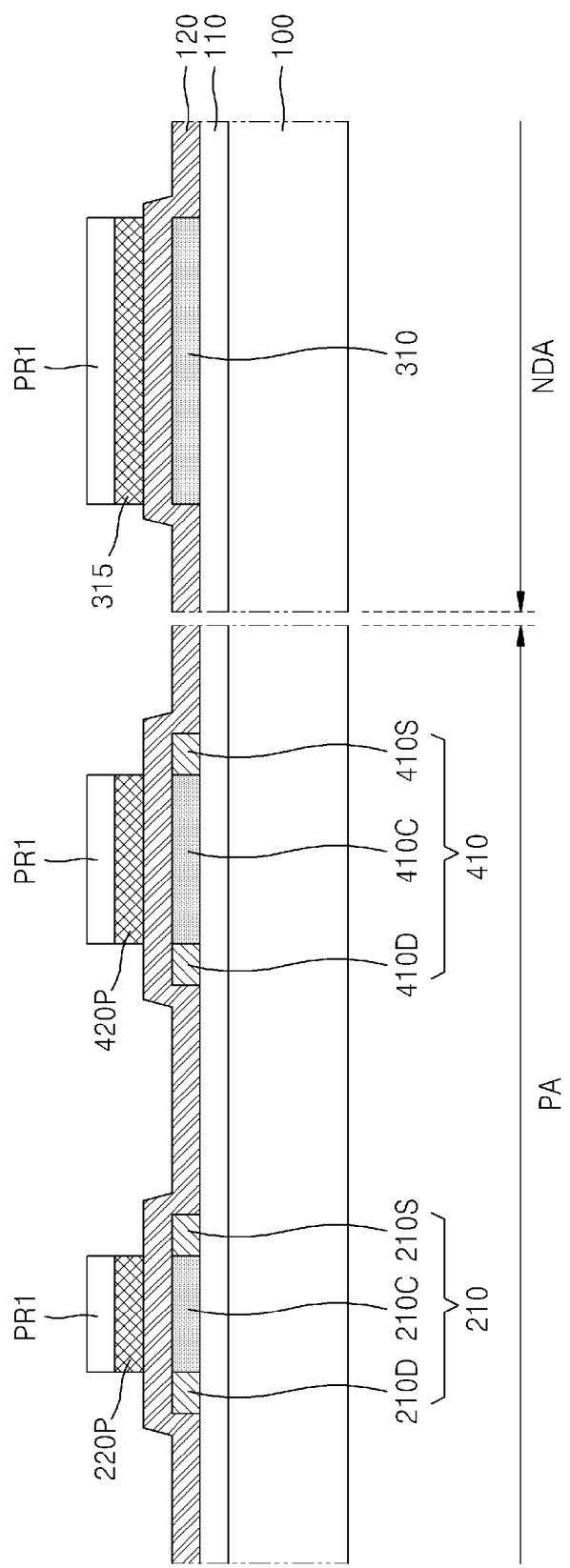

FIG. 4B is a cross-sectional view illustrating a second mask process for the backplane for the display apparatus.

Referring to FIG. 4B, the insulation material layer 120 is formed, and a first metal layer (not shown) is formed and then is patterned by using a first photoresist PR1. As a patterning result, a first metal pattern 220P, a second metal pattern 315, and a third metal pattern 420P are formed on the insulation material layer 120. The insulation material layer 120 may include inorganic materials including $SiO_2$, $SiN_x$, $SiON$, $Al_2O_3$, $TiO_2$, $Ta_2O_5$, $HfO_2$, $ZrO_2$, BST, PZT, or the like.

Widths of the first metal pattern 220P and the third metal pattern 420P are smaller than widths of the first active layer 210 and the third active layer 410, but a width of the second metal pattern 315 is equal to or greater than a width of the second active layer 310.

FIG. 4C is a cross-sectional view illustrating a first doping process for the backplane for the display apparatus.

Referring to FIG. 4C, first doping is performed by using the first through third metal patterns 220P, 315, and 420P as masks. Since the first metal pattern 220P and the third metal pattern 420P are used as the masks, both ends of each of the first active layer 210 and the third active layer 410 are doped with relatively high-density impurity.

Since a width w1 of the first metal pattern 220P is smaller than a width of the first active layer 210, and a width w2 of the third metal pattern 420P is smaller than a width of the third active layer 410, so that the first source area 210S and the first drain area 210D are formed at both ends of the first active layer 210, and the first channel area 210C that is a undoped area is formed between the first source area 210S and the first drain area 210D.

Similarly, the third source area 410S and the third drain area 410D are formed at both ends of the third active layer 410, and the third channel area 410C that is a undoped area is formed between the third source area 410S and the third drain area 410D. On the other hand, the second active layer 310 is covered by the second metal pattern 315, and thus is not doped.

FIG. 4D is a cross-sectional view illustrating a third mask process for the backplane for the display apparatus.

Referring to FIG. 4D, a width of the first photoresist PR1 that is arranged in the pixel area PA is decreased, and then the first metal pattern 220P and the third metal pattern 420P are patterned, so that the first gate electrode 220 and the third gate electrode 420 are formed.

A width w3 of the first gate electrode 220 is smaller than the width w1 of the first metal pattern 220P. In other words, the width w3 of the first gate electrode 220 is smaller than a distance between the first source area 210S and the first drain area 210D. A width w4 of the third gate electrode 420 is smaller than the width w2 of the third metal pattern 420P. In other words, the width w4 of the third gate electrode 420 is smaller than a distance between the third source area 410S and the third drain area 410D.

When the first metal pattern 220P and the third metal pattern 420P are patterned, the insulation material layer 120 is also patterned, so that the first insulating layer 121, the third insulating layer 123, and the fourth insulating layer 124 are formed.

A width w5 of the first insulating layer 121 is substantially the same as the width w3 of the first gate electrode 220, and a width w6 of the third insulating layer 123 is substantially the same as the width w4 of the third gate electrode 420. Also, a width of the fourth insulating layer 124 is substantially the same as a width of the second metal pattern 315.

Figure 4E:
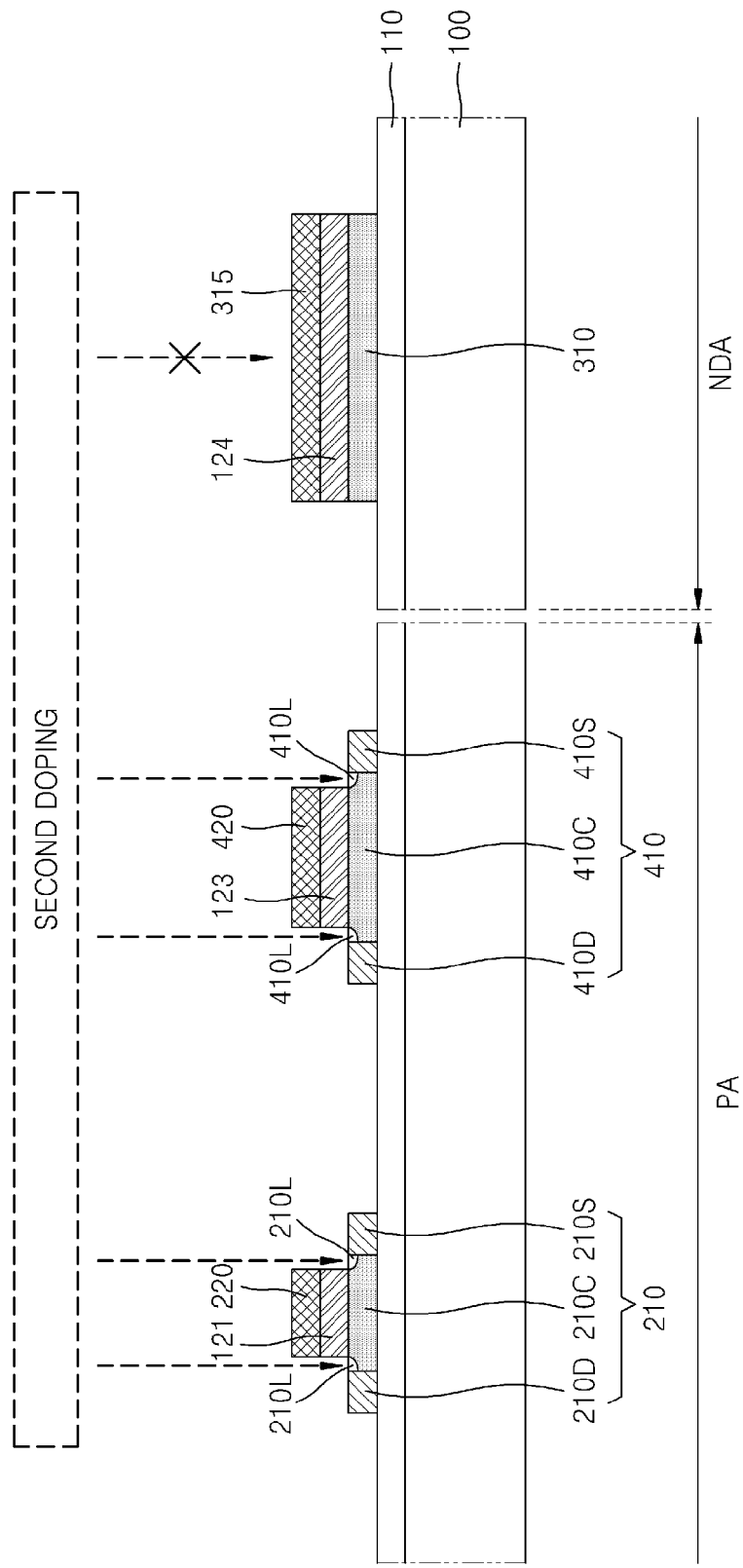

FIG. 4E is a cross-sectional view illustrating a second doping process for the backplane for the display apparatus.

Referring to FIG. 4E, the first photoresist PR1 is removed, and second doping is performed by using the first gate electrode 220, the third gate electrode 420, and the second metal pattern 315 as masks. Since the first gate electrode 220 and the third gate electrode 420 are used as the masks, both ends of each of the first channel area 210C and the third channel area 410C are doped with relatively low-density impurity.

Since the width of the first gate electrode 220 is decreased in the third mask process, portions of both ends of the first channel area 210C that are exposed by the first gate electrode 220 are doped, so that the first low-density doped areas 210L are formed. Similarly, since the width of the third gate electrode 420 is decreased in the third mask process, portions of both ends of the third channel area 410C that are exposed by the third gate electrode 420 are doped, so that the second low-density doped areas 410L are formed.

In the second doping process, the second metal pattern 315 corresponds to a mask, so that the second active layer 310 is not doped.

FIG. 4F is a cross-sectional view illustrating a third doping process for the backplane for the display apparatus.

The third doping process is performed to form halo areas, by using the same masks as those of the second doping process. The third doping process may be performed by using a generally-known halo doping method. Portions of both ends of the first channel area 210C that are exposed by the first gate electrode 220 are doped, so that the first halo doped areas 210H are formed. Portions of both ends of the third channel area 410C that are exposed by the third gate electrode 420 are doped, so that the second halo doped areas 410H are formed.

In the third doping process, the second metal pattern 315 corresponds to a mask, so that the second active layer 310 is not doped.

As described above, after the second doping process is performed, the third doping process is performed. However, embodiments are not limited thereto. In another embodiment, after the third doping process is performed, the second doping process may be performed.

FIG. 4G is a cross-sectional view illustrating a fourth mask process for the backplane for the display apparatus.

Referring to FIG. 4G, after the pixel area PA is masked with second photoresist PR2, the second metal pattern 315 and the fourth insulating layer 124 on the second active layer 310 in the non-display area NDA are removed. By the fourth mask process, the second active layer 310 is exposed.

Figure 4H:
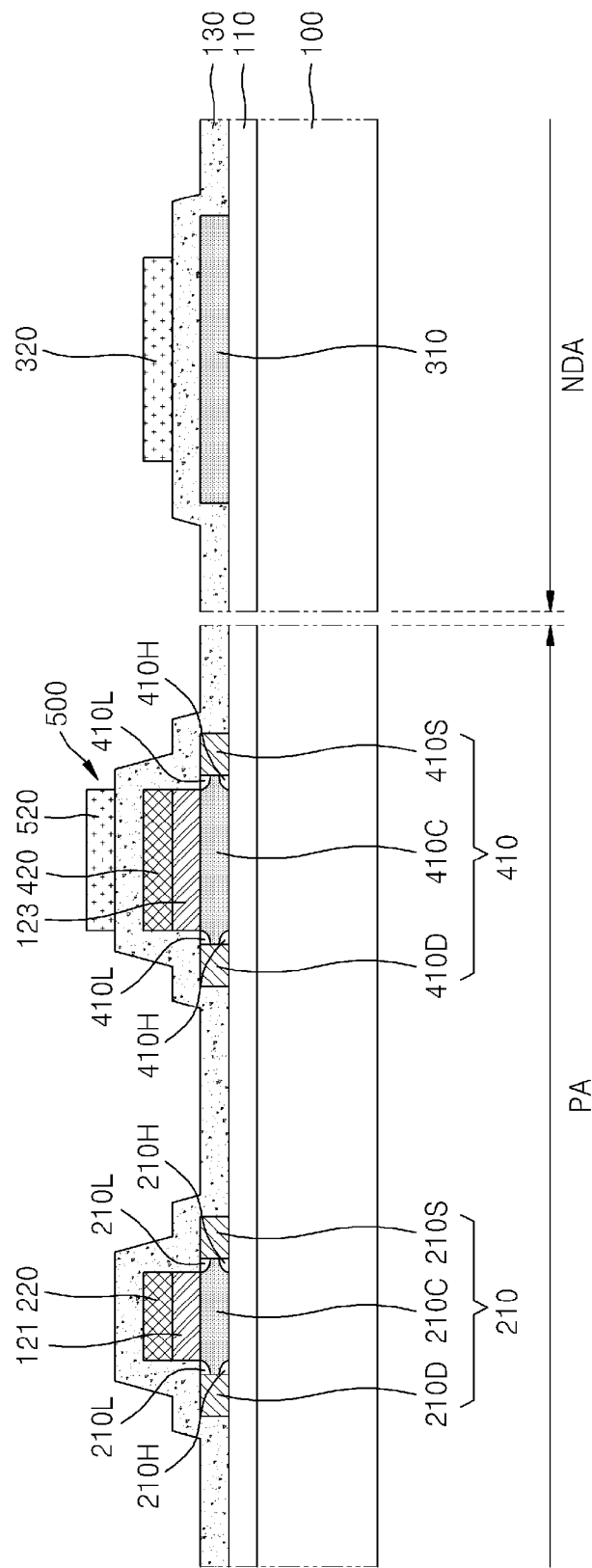

FIG. 4H is a cross-sectional view illustrating a fifth mask process for the backplane for the display apparatus.

Referring to FIG. 4H, the second insulating layer 130 is formed, and a second metal layer (not shown) is formed on the second insulating layer 130 and then is patterned. As a patterning result, the second gate electrode 320 is formed on the second active layer 310, and the second electrode 520 of the storage capacitor 500 is formed on the third gate electrode 420. The third gate electrode 420 simultaneously performs a function as a gate electrode of the third transistor 400 and a function as a first electrode of the storage capacitor 500.

Figure 4I:
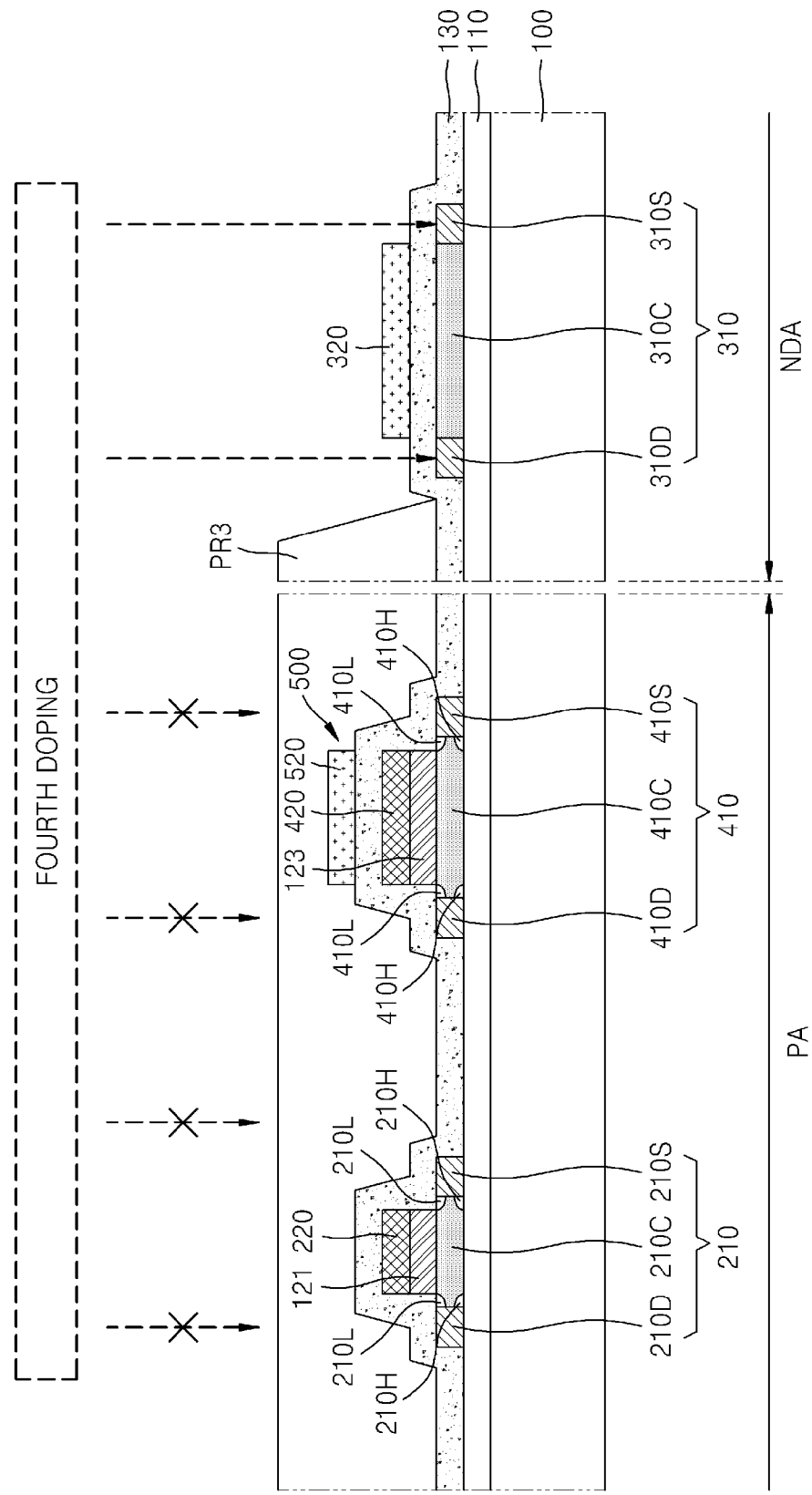

FIG. 4I is a cross-sectional view illustrating a sixth mask process and a fourth doping process for the backplane for the display apparatus.

Referring to FIG. 4I, after third photoresist PR3 is formed to cover the pixel area PA (the sixth mask process), the fourth doping process is performed. By using the second gate electrode 320 as a mask, the second source area 310S and the second drain area 310D of the second active layer 310 are formed.

Figure 4J:
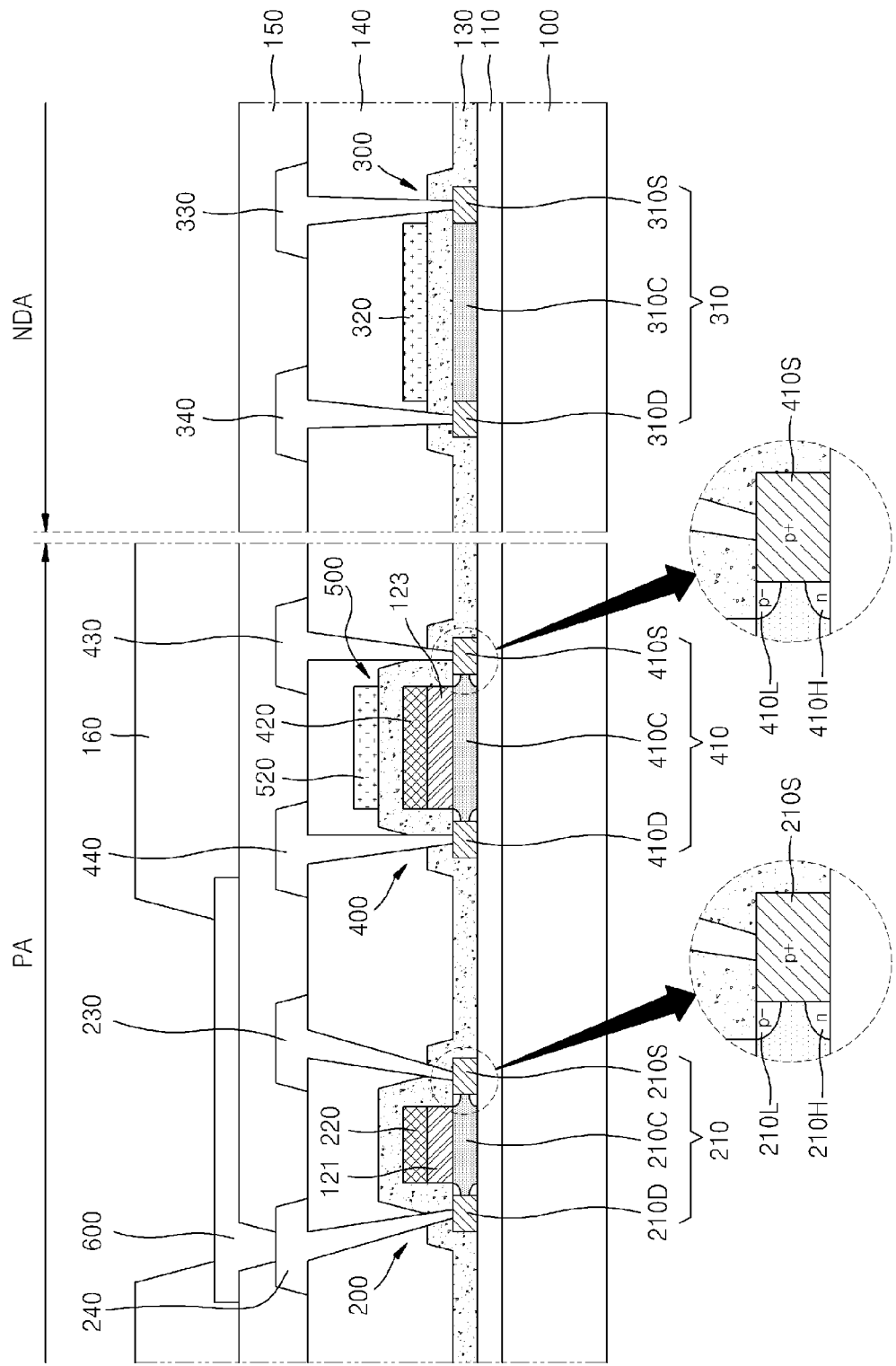

FIG. 4J is a cross-sectional view illustrating seventh through eleventh mask processes for the backplane for the display apparatus.

Referring to FIG. 4J, after the interlayer insulating layer 140 is formed and a contact hole is formed (the seventh mask process), a third metal layer (not shown) is formed and then is patterned. As a patterning result, the first source electrode 230, the first drain electrode 240, the second source electrode 330, the second drain electrode 340, the third source electrode 430, and the third drain electrode 440 are formed (the eighth mask process).

Afterward, a planarization layer 150 is formed and a contact hole is formed (the ninth mask process), and then the pixel electrode 600 is patterned (the tenth mask process). The pixel defining layer 160 is formed and then is patterned, so that an opening for exposing a top surface of the pixel electrode 600 is formed (the eleventh mask process). The pixel defining layer 160 may be formed as an organic insulating layer including polymer derivatives having commercial polymers (PMMA and PS) and a phenol group, an acryl-based polymer, an imide-based polymer, an arylene ether-based polymer, an amide-based polymer, a fluorine-based polymer, a p-xylene-based polymer, a vinylalcohol-based polymer, or a combination thereof.

As described above, the backplane for the display apparatus and the method of manufacturing the backplane according to the one or more of the above embodiments may improve reliability of a transistor.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present invention as defined by the following claims.

What is claimed is:

1. A backplane for a display apparatus, the backplane comprising:
   a substrate including a display area and a non-display area;
   a first transistor comprising a first active layer, a first gate electrode, a first source electrode, and a first drain electrode that are formed on the display area, wherein the first gate electrode, the first source electrode, and the first drain electrode are formed on the first active layer;
   a second transistor comprising a second active layer, a second gate electrode, a second source electrode, and a second drain electrode that are formed on the non-display area, wherein the second gate electrode, the second source electrode, and the second drain electrode are formed on the second active layer;
   a first insulating layer formed between the first active layer and the first gate electrode; and
   a second insulating layer formed between the second active layer and the second gate electrode in the non-display area, and formed on the first gate electrode and above the first active layer in the display area, wherein the first active layer comprises a first channel area, a first source area disposed on a first side of the first channel area, a first drain area disposed on a second side of the first channel area, and a low-density doped area and a halo doped area respectively adjacent to first and second ends of the first channel area, and wherein the second active layer only comprises a second channel area, a second source area disposed on a first side of the second channel area, and a second drain area disposed on a second side of the second channel area.

2. The backplane for the display apparatus of claim 1, wherein the first gate electrode and the second gate electrode are formed on different layers.

3. The backplane for the display apparatus of claim 1, wherein a width of the first insulating layer is substantially the same as a width of the first gate electrode.

4. The backplane for the display apparatus of claim 1, further comprising:
a third transistor comprising a third active layer, a third gate electrode, a third source electrode, and a third drain electrode that are formed on the display area of the substrate, wherein the third gate electrode, the third source electrode, and the third drain electrode are formed on the third active layer; and
a storage capacitor formed overlapping the third transistor.

5. The backplane for the display apparatus of claim 4, wherein the storage capacitor comprises a first electrode and a second electrode which are disposed in parallel to each other and have the second insulating layer interposed therebetween, and wherein the first electrode is the third gate electrode.

6. The backplane for the display apparatus of claim 5, wherein the second electrode of the storage capacitor is formed on the same layer as the gate electrode and comprises a same material as the second gate electrode.

7. The backplane for the display apparatus of claim 4, further comprising a third insulating layer interposed between the third active layer and the third gate electrode and has the substantially same size as the third gate electrode.

8. The backplane for the display apparatus of claim 7, wherein the third insulating layer is formed on the same layer as the first insulating layer and comprises a same material as the first insulating layer.

9. The backplane for the display apparatus of claim 4, wherein the third active layer comprises a third channel area, a third source area disposed on a first side of the third channel area, a third drain area disposed on a second side of the third channel area, and a low-density doped area and a halo doped area that are respectively adjacent to first and second ends of the third channel area.

10. The backplane for the display apparatus of claim 1, wherein a width of the first channel area is smaller than a width of the second channel area.

* * * * *